United States Patent [19]

Saitoh

[11] Patent Number: 4,987,382
[45] Date of Patent: Jan. 22, 1991

[54] MICROWAVE INTEGRATED CIRCUIT HAVING A LEVEL SHIFT CIRCUIT

[75] Inventor: Yasuo Saitoh, Tokyo, Japan

[73] Assignee: NEC Corporation, Japan

[21] Appl. No.: 421,240

[22] Filed: Oct. 13, 1989

[30] Foreign Application Priority Data

Oct. 14, 1988 [JP] Japan ................................. 63-258508

[51] Int. Cl.$^5$ .............................................. H03F 3/16
[52] U.S. Cl. ..................................... 330/277; 330/310
[58] Field of Search ............... 330/277, 286, 287, 296, 330/302, 307, 310

[56] References Cited

U.S. PATENT DOCUMENTS 4,612,514  9/1986  Shigaki et al. ....................... 330/277
4,881,046  11/1989 Tung ................................. 330/277

*Primary Examiner*—Steven Mottola
*Attorney, Agent, or Firm*—Laff, Whitesel, Conte & Saret

[57] ABSTRACT

A microwave integrated circuit having a level shift circuit includes level shift diodes connected in series, a transistor resistor connected to form a two-terminal device which serves as a resistance, a field effect transistor and a series resonant circuit. The field effect transistor may be a GaAs field effect transistor and has a gate electrode receiving an input signal having frequency ranges from D.C. to super high frequencies, a drain electrode connected to the drain voltage line and a source electrode connected, through the series connection of the level shift diodes, to the transistor resistor and an output terminal. The series resonant circuit comprises a peaking capacitance and a peaking inductance and is provided in parallel with the level diodes. The series resonant circuit connected in parallel with the level shift diodes enables to reduce the device area for the level shift circuit and improves high frequency characteristics thereof.

11 Claims, 2 Drawing Sheets

MICROWAVE INTEGRATED CIRCUIT HAVING A LEVEL SHIFT CIRCUIT

BACKGROUND OF THE INVENTION

The present invention relates to an integrated circuit device and, more particularly, to a GaAs integrated circuit device having a directly coupled D.C. type level shift circuit.

As used hereinafter, the term "integrated circuit" refers to a unitary semiconductor device or chip which is the equivalent of a network of interconnected active and passive circuit elements.

In a directly coupled type GaAs integrated circuit, it has been known to use a level shift circuit in input and output stages to match the D.C. level of an input signal to the particular D.C. level that is required in an integrated circuit or the D.C. level of an output signal to the D.C. level that is required by an external circuit receiving the output signal.

A conventional level shift circuit is disclosed, for example by shigaki et al, "GaAs Monolithic Front End IC" in Technical Report (SSD 85-115), pp 49–56, published by the Electronics and Communication Association, Japan, 1985.

FIG. 3 shows a schematic circuit diagram of an example of a known integrated circuit having level shift circuits in an input stage and in an output stage.

Super high frequency amplifying stages (not shown in FIG. 3) are connected in cascade between an input stage $20_A$ and an output stage $20_B$. The input and output stages $20_A$ and $20_B$ have input buffers $1a$ and $1b$ formed of a source-grounded amplifying circuit and level shift circuits $2_A$ and $2_B$.

Each of the level shift circuits in the level shift circuits $2_A$ and $2_B$ has a GaAs field effect transistors $J_2$ formed of GaAs and having a drain electrode connected to a drain voltage line $V_{DD}$, a gate electrode receiving from the input buffer $1a$ or $1b$ an input signal $V_{Ga}$ and a source electrode connected to a transistor-resistor $J_3$ and an output terminal $T_{oa}$ or $T_{ob}$ via a serially connected level shift diodes $D_1$–$D_4$ formed of metal-semiconductor junction diodes.

The input signal $V_{ia}$ supplied to an input terminal $T_{Ia}$ of the input buffer $1a$ in the input stage $20_A$ is applied to a gate electrode of a GaAs field effect transistor $J_1$. An amplified output is derived from a connection of a drain electrode thereof and a load resistor $R_1$. The D.C. level of the input signal $V_{Ga}$ at the connection to be forwarded to a level shift circuit $2_A$ is shifted towards the level of the power voltage line $V_{DD}$. Thus, the series connection of the level shift diodes $D_1$–$D_4$ is used in order to have the level in D.C. level of the input signal $V_{Ga}$ match to the D.C. level required by the following internal stage in the integrated circuit. The transistor-resistor $J_3$ is formed by a gate-source connected GaAs field effect transistor.

In such a conventional level shift circuit as explained hereinabove, it was desired for the junction areas of level shift diodes to be made smalled in order to reduce the overall power consumption and the chip size of the integrated circuit. However, metal-semiconductor junction diodes with smaller junction area have larger forward resistance. The increased resistance and a stray capacitance $C_S$ between the output terminal $T_{oa}$ and the source voltage line $V_{SS}$ form a low pass filter, which deteriorates the high frequency characteristics of the level shift circuit.

SUMMARY OF THE INVENTION

An object of the present invention is to provide an integrated circuit having a level shift circuit which has low power consumption and is of the reduced size but exhibits good high frequency characteristics.

According to the present invention, an integrated circuit having a level shift circuit includes a level shift diodes connected in series for level shifting, a resistor formed of a transistor connected to form a two terminal device which serves as a resistor, a field effect transistor which has a gate electrode receiving an input signal, a drain electrode connected to a power voltage line and a source electrode connected, through the level shift diodes, to the output terminal and the resistor and, further a peaking circuit provided in parallel with the level shift diodes. The main feature of the present invention resides in the inclusion of the peaking circuit which is for preventing the frequency characteristics from lowering in a high frequency range. The peaking circuit may be formed by a series resonant circuit having a peaking capacitance and a peaking inductance, provided in parallel with the level shift diodes.

BRIEF DESCRIPTION OF THE DRAWINGS

The above and other objects, features and advantages of the present invention will be apparent from the following dscription of preferred embodiments of the invention with reference to the accompanying drawings, wherein.

DETAILED DESCRIPTION OF THE INVENTION

A preferred embodiment of the present invention is hereinafter explained with reference to the appended drawings.

Figure 1:
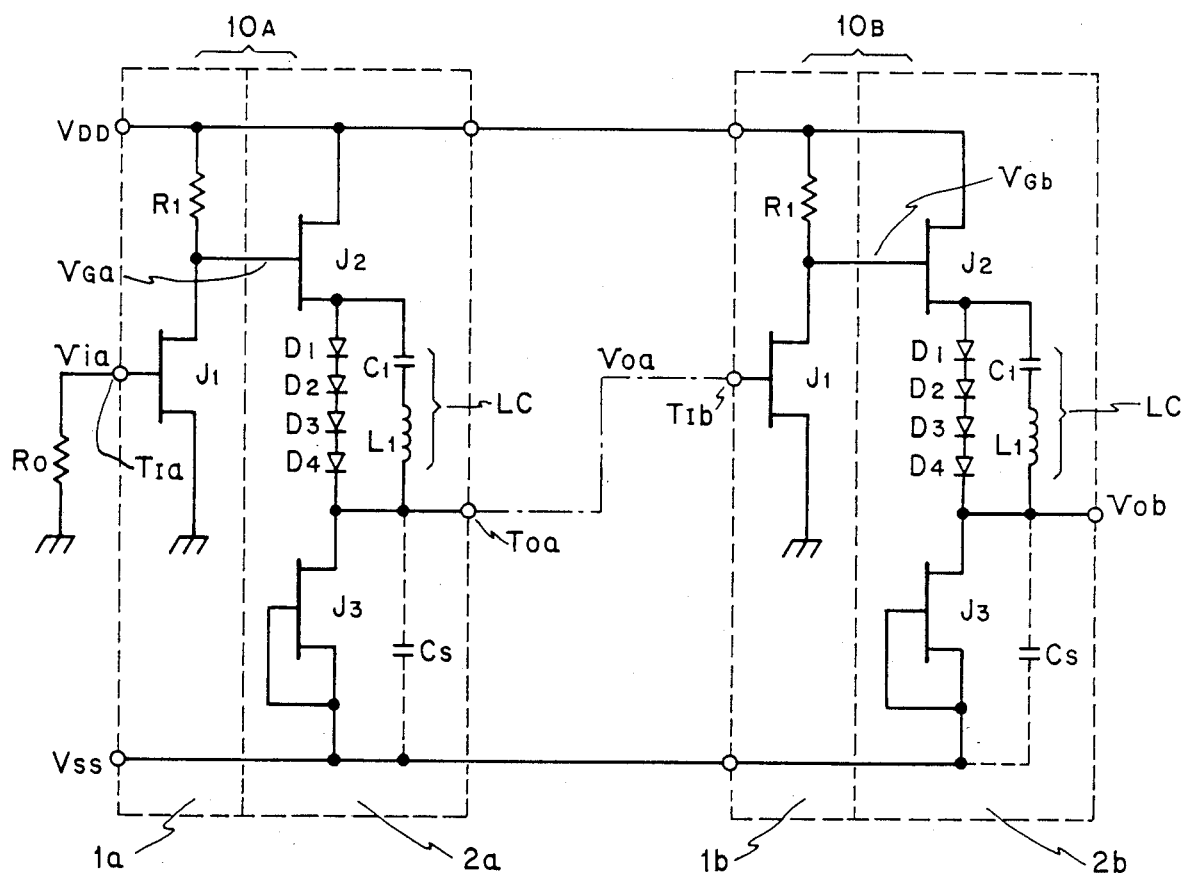
FIG. 1 shows a circuit diagram of an embodiment of the integrated circuit according to the present invention.

FIG. 1 is a circuit diagram of an integrated circuit according to a preferred embodiment of the present invention.

In the integrated circuit shown in FIG. 1, high frequency amplifying states are connected in cascade between an input stage $10_A$ and an output stage $10_B$. Each of these input and output stages $10_A$ and $10_B$ has an input buffer $1a$ or $1b$ formed of a source-grounded amplifying circuit and a level shift circuit $2a$ or $2b$ following the input buffer $1a$ or $1b$. Each of these source-grounded amplifying circuits in the input stages $1a$ and $1b$ comprises a field effect transistor $J_1$ which has a source electrode grounded, a drain electrode connected to a load resistor $R_1$ of 440 $\Omega$ and a gate electrode receiving an input signal $V_{ia}$ or $V_{oa}$ from an input terminal $T_{Ia}$ or $T_{Ib}$. An amplified output is derived from the drain electrode of the field effect transistor $J_1$. The field effect transistor $J_1$ in the present embodiment is a GaAs field effect transistor.

Each of the level shift circuits $2a$ and $2b$ has a first power supply terminal $V_{DD}$, a second power supply terminal $V_{SS}$, and output terminal $T_{oa}$ or $T_{ob}$, a series of level shift diodes $D_1$–$D_4$, a transistor-resistor $J_3$, a field effect transistor $J_2$ and a frequency-characteristics compensation circuit LC. The level shift diodes $D_1$ to $D_4$ are made of metal-semiconductor junction diodes connected in series for level shifting and the transistor-resistor $J_3$ has its gate electrode and source electrode connected together so as to form a two-terminal device which serves as a resistor. One terminal of the transistor-resistor $J_3$ is connected to the second power supply terminal $V_{SS}$. The transistor-resistor $J_3$ in the present embodiment is a GaAs field effect transistor.

The field effect transistor $J_2$ has a gate electrode receiving an input signal having frequency ranges from D.C. to super high frequencies, a drain electrode connected to the first power supply terminal $V_{DD}$ and a source connected to the output terminal $T_{oa}$ or $T_{ob}$ through the series connection of level-shift diodes $D_1$–$D_4$. The field effect transistor $J_2$ in the present embodiment is a GaAs field effect transistor.

The D.C. level in the input signal $V_{Ga}$ to be supplied to the level shift circuit $2a$ is shifter towards a drain supply voltage of 5 V. Thus, the function of the series connection of the level shift diodes $D_1$–$D_4$ is to match the level of the input signal $V_{Ga}$ to the D.C. level required by the following stage in the integrated circuit.

the frequency-characteristics compensation circuit LC is a peaking circuit formed of a series resonant circuit in which a peaking capacitance $C_1$ and a peaking inductance $L_1$ are connected in series, and which is provided in parallel with the level shift diodes $D_1$–$D_4$ for preventing lowering of frequency characteristics in a high frequency range, that is, for providing a falt frequency characteristic in a broad band ranging from D.C. to a microwave frequency. The series resonant circuit LC with the peaking capacitance $C_1$ and the peaking inductance $L_1$ provides a flat frequency characteristic in a broad band ranging from D.C. to a microwave frequency. The peaking capacitance $C_1$ is formed by metal-insulator-metal layers and the peaking inductance $L_1$ is formed by a metallized strip of a predetermined length.

The gate width of each of the GaAs field effect transistor $J_2$ and the GaAs resistance transistor $J_3$ are 50 $\mu$m. Each of the level shift diodes $D_1$–$D_4$ has a metal-semiconductor junction area having a side of 50 $\mu$m and have a forward voltage drop of 0.7 V. The operating region of the diodes is in a region where the series resistance value is small.

The microwave integrated circuit embodying the present invention comprises a plurality of super high frequency amplifying stages connected in cascade between the input and output stages $10_A$ and $10_B$ having the source-grounded input buffer $1a$ or $1b$ and the aforementioned level shift circuit $2a$ $2b$.

Figure 2:
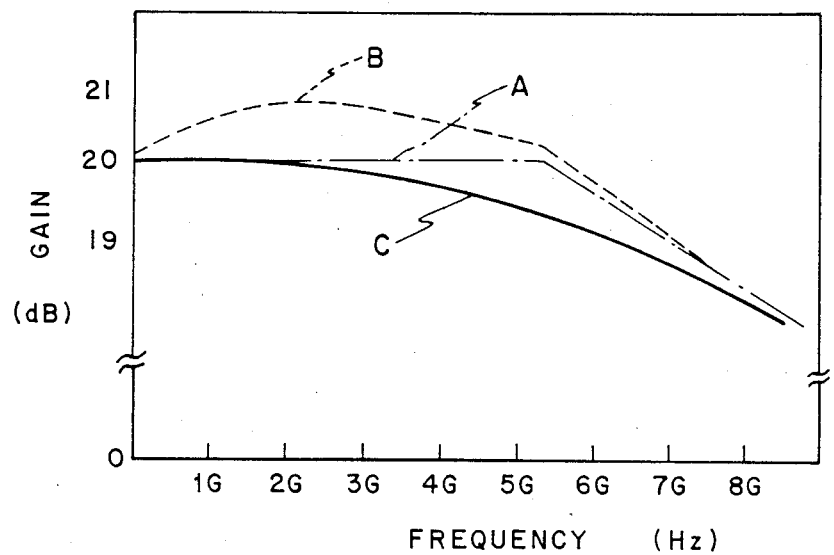
FIG. 2 shows frequency characteristics of an example of the integrated circuit according to the embodiment shown in FIG. 1.
Figure 3:
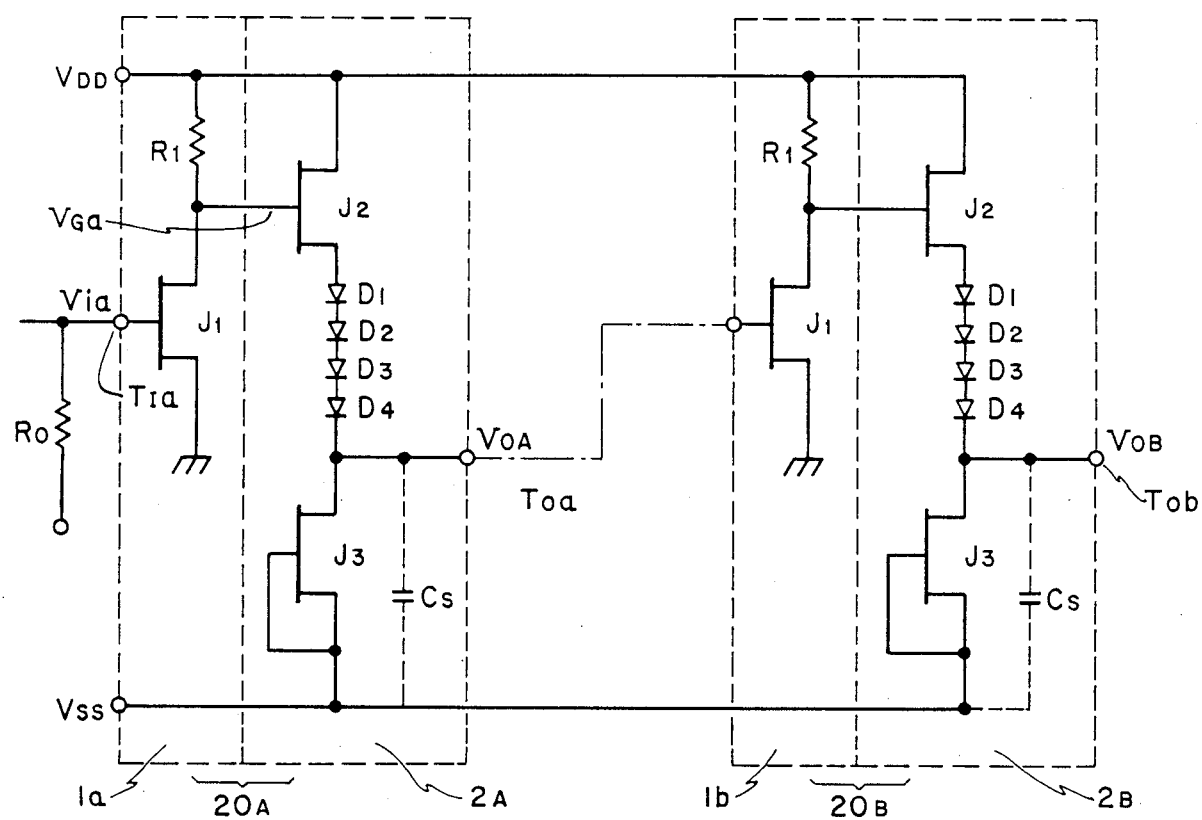
FIG. 3 shows a schematic circuit diagram of an example of a conventional integrated circuit.

FIG. 2 illustrates frequency characteristics to show characteristics of the integrated circuit shown in FIG. 1 according to the preferred embodiment of the present invention.

Curve B shows a gain vs. frequency characteristic of an instance where the peaking capacitance $C_1$ is 2 pF and the peaking inductance $L_1$ is negligibly small.

Curve A shows a resonant state at 6 GHz in the instance where the peaking capacitance $C_1$ is 1 pF and the peaking inductance $L_1$ is 0.7 nH.

Each of the characteristic curves A, B, C has commonly a gain of 20 dB and the cut-off frequency at which the gain decreases by 3 dB is 7.0 GHz for the curve A, 7.0 GHz for the curve B and 5.8 GHz for the curve C. It is to be noted that the characteristic curve A demonstrates a flat frequency characteristic and hence a significant improvement over that shown by the curve C.

Thus, because of the arrangement according to the present invention wherein the series resonant circuit having a comparatively small inductance value and small capacitance value is connected in parallel with the level shift diodes, it is possible to provide a level shift circuit which is compact and with which the high frequency characteristics are significantly improved.

While the invention has been described in its preferred embodiment, it is to be understood that the words which have been used are words of description rather than limitation and that the changes within the purview of the appended claims may be without departing from the true scope and spirits of the invention its broader aspect.

What is claimed is:

1. A level shift circuit in a microwave integrated circuit comprising:
    a first power supply terminal, a second power supply terminal, and an output terminal;
    level shift diodes connected in series for level shifting;
    a resistor having one terminal connected to said second power supply terminal;
    a field effect transistor having a gate electrode receiving an input signal, a drain electrode connected to said first power supply terminal and a source electrode connected, through the series connection of said level shift diodes, to the other terminal of said resistance transistor and said output terminal; and
    a peaking means provided in parallel with said level shift diodes for providing a flat frequency characteristic in a broad band ranging form D.C. to a microwave frequency.

2. A level shift circuit in a microwave integrated circuit comprising:
    a first power supply terminal, a second power supply terminal, and an output terminal;
    level shift diodes connected in series for level shifting;
    a resistor having one terminal connected to said second power supply terminal;
    a field effect transistor having a gate electrode receiving an input signal, a drain electrode connected to said first power supply terminal and a source electrode connected, through the series connection of said level shift diodes, to the other terminal of said resistance transistor and said output terminal; and
    a series resonant circuit having a peaking capacitance and a peaking inductance provided in parallel with said level shift diodes for preventing lowering of frequency characteristics in a high frequency region.

3. A level shift circuit in a microwave integrated circuit according to claim 2 in which said peaking capacitance is one formed by metal-insulator-metal layers and said peaking inductance is one formed by a metallized strip of a predetermined length.

4. A level shift circuit in a microwave integrated circuit according to claim 1 in which said field effect transistor is a GaAs field effect transistor.

5. A level shift circuit in a microwave integrated circuit according to claim 1 in which said resistor is a gate-source connected GaAs field effect transistor.

6. A microwave integrated circuit including an input stage, an output stage and a plurality of super high frequency amplifying stages connected in cascade between said input and output stages, each of said input and output stages comprising:

an input buffer including an input terminal and a source-grounded transistor receiving an input signal from said input terminal; and a level shift circuit connected to said input buffer circuit and including a first power supply terminal, a second power supply terminal, an output terminal, level shift diodes connected in series for level shifting, a resistor having one terminal connected to said second power supply terminal, a field effect transistor having a gate electrode receiving an input signal, a drain electrode connected to said first power supply terminal and a source electrode connected, through the series connection of said level shift diodes, to the other terminal of said resistor and said output terminal, and a peaking means provided in parallel with said level shift diodes for providing a flat frequency characteristic in a broad band ranging from D.C. to a microwave frequency.

7. A microwave integrated circuit including a plurality of super high frequency amplifying devices connected in cascade, at least one of said amplifying devices comprising:

an amplifying circuit including an input terminal and a source-grounded transistor receiving an input signal from said input terminal; and a level shift circuit connected to said amplifying circuit and including a first power supply terminal, a second power supply terminal, an output terminal, level shift diodes connected in series for level shifting, a resistor formed of a transistor circuited to serve as a resistor having one terminal connected to said second power supply terminal, a field effect transistor having a gate electrode receiving an input signal, a drain electrode connected to said first power supply terminal and a source electrode connected, through the series connection of said level shift diodes, to the other terminal of said resistance transistor and said output terminal, and a series resonant circuit having a peaking capacitance and a peaking inductance provided in parallel with said level shift diodes for preventing lowering of frequency characteristics in a high frequency region.

8. A microwave integrated circuit according to claim 7, in which said peaking capacitance is one formed by metal-insulator-metal layers and said peaking inductance is one formed by a metallized strip of a predetermined length.

9. A microwave integrated circuit according to claim 6 in which said field effect transistor is a GaAs field effect transistor.

10. A microwave integrated circuit according to claim 6 in which said resistor is formed of a gate-source connected GaAs field effect transistor.

11. A microwave integrated circuit according to claim 6 in which said source-grounded transistor is a GaAs field effect transistor.

* * * * *